(12) United States Patent
Osaki et al.

(10) Patent No.: US 9,142,512 B2
(45) Date of Patent: *Sep. 22, 2015

(54) SEMICONDUCTOR MEMORY DEVICE HAVING A WIRING IN WHICH A STEP IS PROVIDED

(71) Applicant: KABUSHIKI KAISHA TOSHIBA, Minato-ku (JP)

(72) Inventors: Tomoya Osaki, Yokkaichi (JP); Naohito Morozumi, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/319,864

(22) Filed: Jun. 30, 2014

(65) Prior Publication Data

US 2014/0312509 A1  Oct. 23, 2014

Related U.S. Application Data

(63) Continuation of application No. 13/600,565, filed on Aug. 31, 2012, now Pat. No. 8,785,980.

(30) Foreign Application Priority Data

Mar. 23, 2012  (JP) .................................. 2012-68203

(51) Int. Cl.
*H01L 23/48* (2006.01)
*H01L 23/52* (2006.01)
(Continued)

(52) U.S. Cl.
CPC ...... *H01L 23/5386* (2013.01); *H01L 23/49838* (2013.01); *H01L 27/2409* (2013.01); *H01L 27/2481* (2013.01); *H01L 45/16* (2013.01); *H01L 45/04* (2013.01); *H01L 45/1233* (2013.01); *H01L 45/146* (2013.01); *H01L 45/149* (2013.01); *H01L 45/1675* (2013.01); *H01L 2924/0002* (2013.01)

(58) Field of Classification Search
CPC ... H01L 23/258; H01L 27/0207; H01L 45/04; H01L 27/24; H01L 2924/01013; H01L 2924/01029; H01L 27/112; H01L 2924/01078; H01L 27/0802; H01L 21/205
USPC ........ 257/4, 776, 211, 208, E21.004, E27.01, 257/E47.001, E21.001, E29.001, E21.602; 438/128, 382, 482; 365/148, 189.011, 365/207, 218
See application file for complete search history.

(56) References Cited

U.S. PATENT DOCUMENTS 8,062,940 B2 * 11/2011 Ko et al. ...................... 438/197
8,785,980 B2 *  7/2014 Osaki et al. .................. 257/211
(Continued)

FOREIGN PATENT DOCUMENTS

JP  2008-91519  4/2008
JP  2010-40820  2/2010
(Continued)

*Primary Examiner* — A. Sefer
*Assistant Examiner* — Dilinh Nguyen
(74) *Attorney, Agent, or Firm* — Oblon, McClelland, Maier & Neustadt, L.L.P.

(57) ABSTRACT

A semiconductor memory device includes a memory cell array layer which includes a first wiring line, a memory cell stacked on the first wiring line, and a second wiring line formed on the memory cell so as to intersect the first wiring line, wherein a step is formed in the first wiring line so that the height of an upper surface of the first wiring line in the memory cell array region where the memory cell array is formed is higher than the height in a peripheral region around the memory cell array region.

5 Claims, 18 Drawing Sheets

(51) Int. Cl.
*H01L 29/40* (2006.01)
*H01L 47/00* (2006.01)
*H01L 27/10* (2006.01)
*H01L 23/538* (2006.01)
*H01L 23/498* (2006.01)
*H01L 45/00* (2006.01)
*H01L 27/24* (2006.01)

(56) References Cited

U.S. PATENT DOCUMENTS

2006/0292793 A1  12/2006  Sandhu et al.
2010/0032637 A1  2/2010  Kinoshita et al.
2010/0283026 A1  11/2010 Mikawa et al.
2011/0032746 A1  2/2011  Maejima et al.
2011/0069531 A1  3/2011  Aburada et al.

FOREIGN PATENT DOCUMENTS

| | | |
|---|---|---|
| JP | 2011-54259 | 3/2011 |
| JP | 2011/66337 | 3/2011 |
| WO | 2009/081595 A1 | 7/2009 |

\* cited by examiner

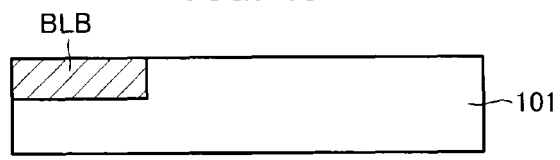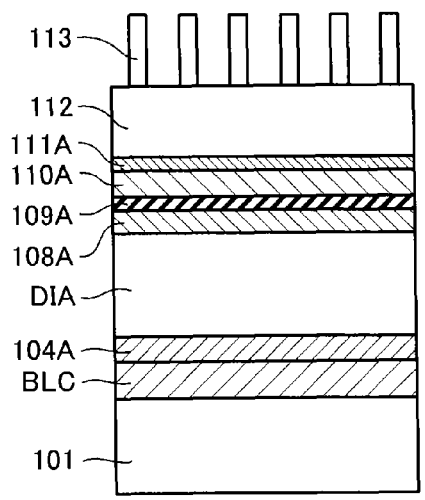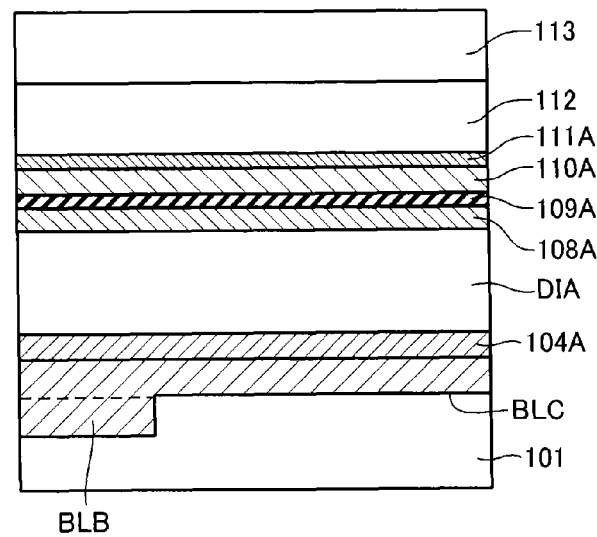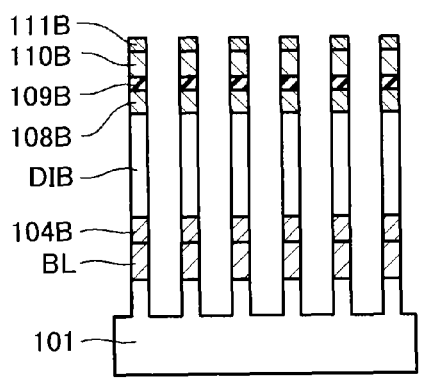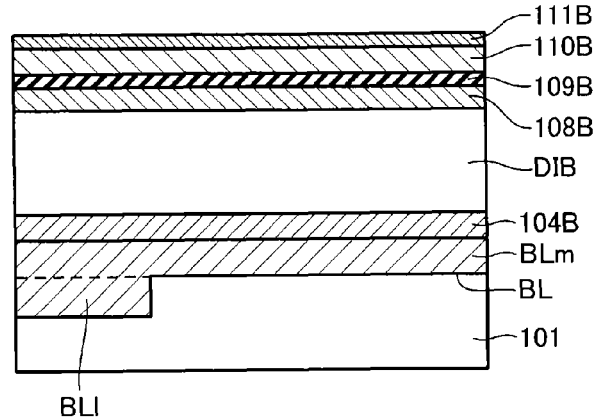

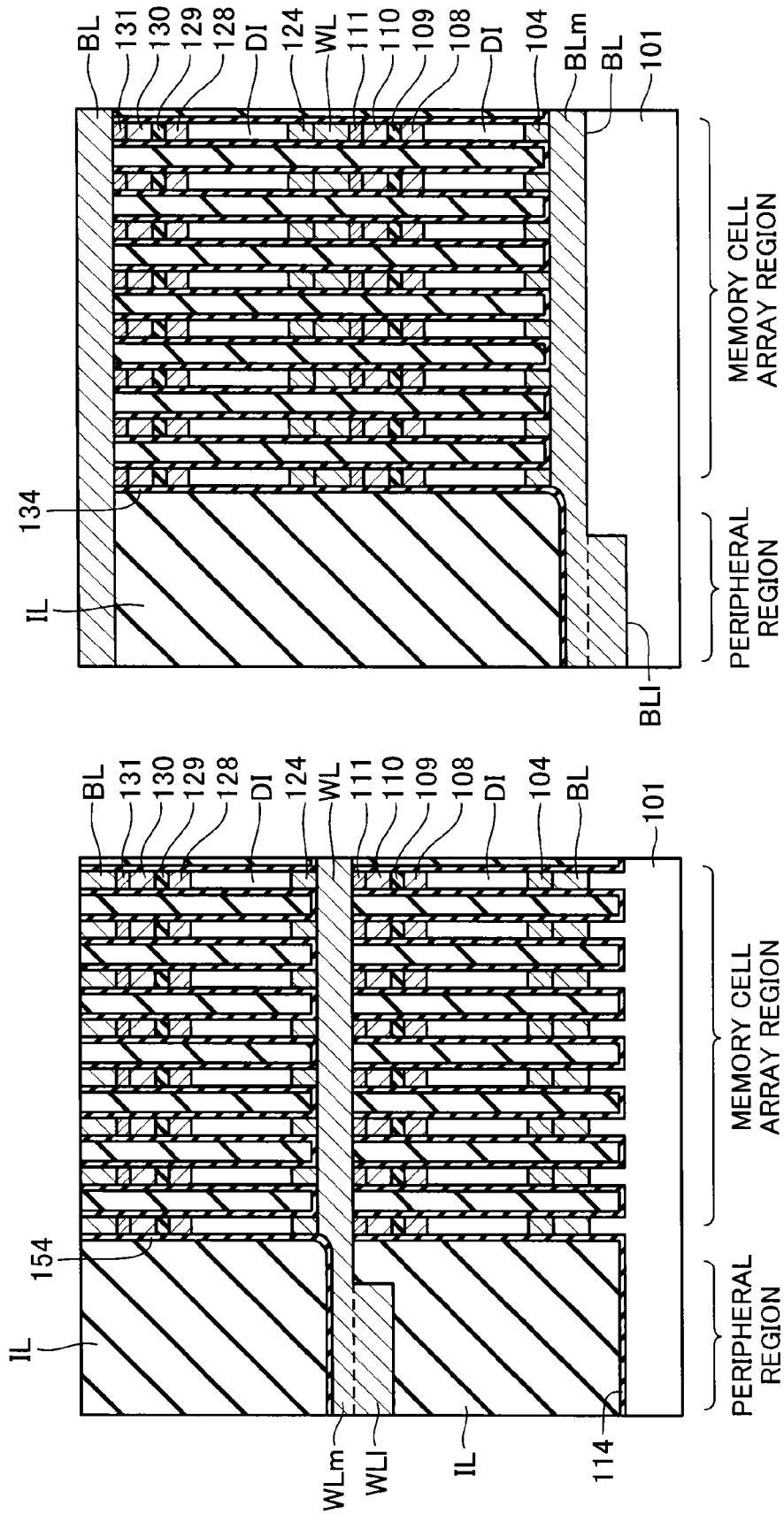

SEMICONDUCTOR MEMORY DEVICE HAVING A WIRING IN WHICH A STEP IS PROVIDED

CROSS-REFERENCE TO RELATED APPLICATIONS

This application is a continuation of U.S. application Ser. No. 13/600,565 filed Aug. 31, 2012, and is based upon and claims the benefit of priority from the prior Japanese Patent Application No. 2012-068203, filed on Mar. 23, 2012, the entire contents of each of which are incorporated herein by reference.

FIELD

Embodiments described herein relate to a semiconductor memory device and a method of manufacturing the same.

BACKGROUND

Description of the Related Art

In the related art, a flash memory in which memory cells having a floating gate structure are NAND-connected or NOR-connected to one another to form a cell array is known as an electrically rewritable non-volatile memory. Moreover, a ferroelectric memory is also known as a non-volatile memory that allows high-speed random access.

Meanwhile, a resistance-variable memory that uses a variable resistance element in a memory cell is proposed as a technology for further miniaturizing a memory cell. Examples of the variable resistance element include a phase-variable memory element that changes a resistance value according to a change in the state (crystal or amorphous state) of a chalcogenide compound, an MRAM element that uses a change in resistance due to a tunnel magneto-resistance effect, a memory element of a polymer ferroelectric RAM (PFRAM) in which a resistance element is formed of a conductive polymer, and a ReRAM element that changes a resistance value according to application of an electric pulse.

In this type of semiconductor memory device, it is desirable to suppress an increase in a wiring line resistance due to miniaturization as much as possible.

BRIEF DESCRIPTION OF THE DRAWINGS

FIGS. 6A and 6B are side cross-sectional views for explaining a method of manufacturing the memory cell array;
FIGS. 7A and 7B are side cross-sectional views for explaining a method of manufacturing the memory cell array;
FIGS. 8A and 8B are side cross-sectional views for explaining a method of manufacturing the memory cell array;
FIGS. 17A and 17B are side cross-sectional views illustrating the structure of a memory cell array of a semiconductor memory device according to a fourth embodiment.

DETAILED DESCRIPTION

In general, according to one embodiment, a semiconductor memory device is provided. The semiconductor memory device includes a memory cell array layer which includes a first wiring line, a memory cell stacked on the first wiring line, and a second wiring line formed on the memory cell so as to intersect the first wiring line, wherein a step is formed in the first wiring line so that the height of an upper surface of the first wiring line in the memory cell array region where the memory cell array is formed is higher than the height in a peripheral region around the memory cell array region.

Exemplary embodiments of a nonvolatile semiconductor memory device and a method of manufacturing the same will be explained in detail with reference to the accompanying drawings.

[First Embodiment]
[Memory Cell Array]

Figure 1:
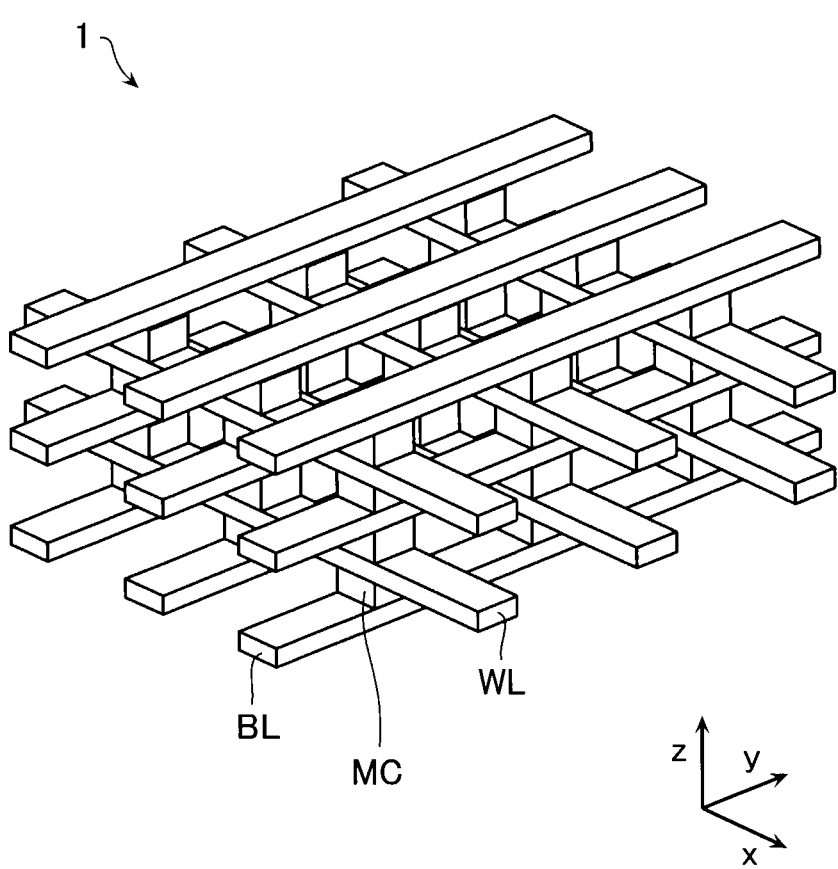
FIG. 1 is a perspective view illustrating the structure of a memory cell array of a semiconductor memory device according to a first embodiment.

FIG. 1 is a perspective view of a part of a memory cell array 1. As illustrated in FIG. 1, the memory cell array 1 is a cross-point memory cell array in which a plurality of word lines WL are arranged in parallel and a plurality of bit lines BL are arranged in parallel so as to intersect the word lines WL. Memory cells MC described later are disposed at the respective intersections of the word lines WL and the bit lines BL so as to be interposed between both wiring lines. Here, a planar region in which the memory cells MC are disposed in a matrix form is referred to as a "memory cell array region" and a region around the memory cell array region is referred to as a "peripheral region."

[Memory Cell MC]

Figure 2A:
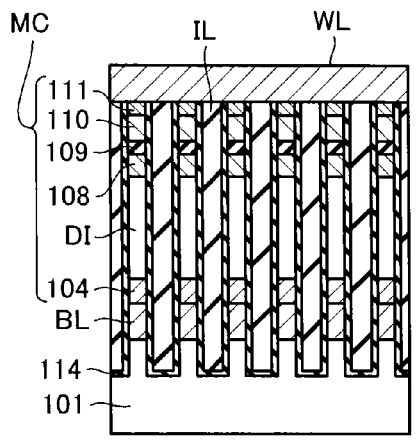
FIGS. 2A and 2B are side cross-sectional views illustrating the structure of the memory cell array.
Figure 2B:
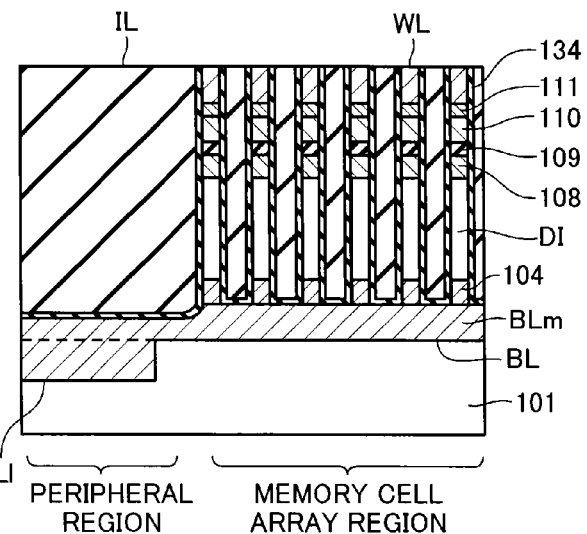

FIGS. 2A and 2B are cross-sectional views of the memory cell array 1, in which FIG. 2A is a cross-sectional view as seen from an extension direction of the bit lines BL, and FIG. 2B is a cross-sectional view as seen from an extension direction of the word lines WL. As illustrated in FIGS. 2A and 2B, the memory cell MC includes a variable resistance element 109 and a current-rectifying element DI that are connected in series between the word line WL and the bit line BL. The variable resistance element 109 and the current-rectifying element DI are connected in series through electrodes 111, 110, 108, and 104. Moreover, the side surfaces of the memory cell MC are further covered by barrier layers 114 and 134. An interlayer insulating layer IL is filled between the memory cells MC with the barrier layer 114 interposed.

[Word Line WL and Bit Line BL]

As illustrated in FIG. 2B, in a boundary portion between the memory cell array region and the peripheral region of the memory cell array 1, a step is formed in the bit line BL so that the height of the step decreases as the step extends from the memory cell array region to the peripheral region. That is, the height of the upper surface of the bit line BL in the peripheral region is formed to be lower than the memory cell array region, and the lower surface of the bit line BL in the peripheral region is formed to be lower than the lower surface of the bit line BL in the memory cell array region. Due to this, the thickness of the bit line BL in the peripheral region is formed to be equal to or greater than the thickness of the bit line BL in the memory cell array region.

The height difference (step) between the memory cell array region and the peripheral region on the upper surface of the bit line BL occurs due to a loading effect when forming a word line pattern by etching during the manufacturing steps. When such a situation occurs, there is a problem in that the thickness of the bit line or the word line in the peripheral region decreases so that the wiring line resistance increases.

Therefore, in the embodiment, a lower wiring line layer BLl is provided under a portion of the peripheral region where the bit line BL extends, and a main wiring line layer BLm is formed on the lower wiring line layer BLl. In this way, the amount of the decrease in the thickness of the bit line BL in the peripheral region due to the loading effect is compensated by the lower wiring line layer BLl, whereby the increase of the wiring line resistance is suppressed.

The word line WL and the bit line BL are desirably formed of a material that is highly resistant to heat and has a low resistance value. For example, tungsten (W), titanium (Ti), a tungsten nitride (WN), a titanium nitride (TiN), a tungsten silicide (WSi), a nickel silicide (NiSi), a cobalt silicide (CoSi), and the like can be used.

[Manufacturing Method]

Next, a method of manufacturing the semiconductor memory device according to the embodiment will be explained with reference to FIGS. 3A to 12B. In FIGS. 3A to 12B, FIGS. 3A, 4A, . . . , and 12A are cross-sectional views as seen from the y-axis direction (the extension direction of the bit line BL) of FIG. 1, and FIGS. 3B, 4B, . . . , and 12B are cross-sectional views as seen from the x-axis direction (the extension direction of the word line WL) of FIG. 1.

Figure 3A:
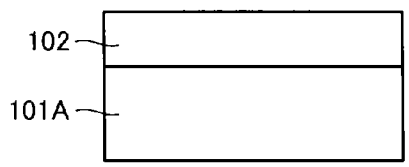
FIGS. 3A and 3B are side cross-sectional views for explaining a method of manufacturing the memory cell array.
Figure 3B:
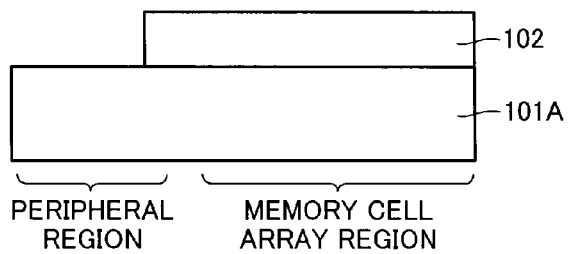
Figure 4A:
FIGS. 4A and 4B are side cross-sectional views for explaining a method of manufacturing the memory cell array.
Figure 4B:
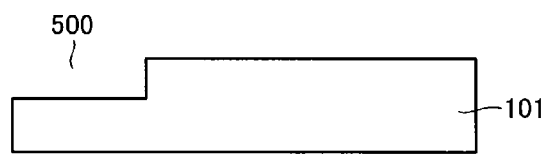
Figure 5A:
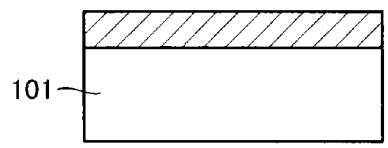
FIGS. 5A and 5B are side cross-sectional views for explaining a method of manufacturing the memory cell array.
Figure 5B:
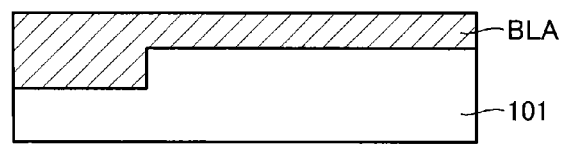

First, a semiconductor substrate with a peripheral circuit that controls writing and reading of data to and from the memory cell array 1 or an insulating layer formed on the semiconductor substrate is prepared as a substrate 101A. As illustrated in FIGS. 3A and 3B, a mask 102 is deposited on the substrate 101A so as to cover the entire memory cell array region to obtain a substrate 101. Etching is performed as illustrated in FIGS. 4A and 4B to form a concave portion 500 in a part of the peripheral region of the substrate 101. Subsequently, as illustrated in FIGS. 5A and 5B, a lower wiring line forming layer BLA serving as the lower wiring line layer BLl is formed on the substrate 101 so as to fill the concave portion 500. Then, as illustrated in FIGS. 6A and 6B, the upper surface of the lower wiring line forming layer BLA is planarized according to a CMP method or the like to form a lower wiring line forming layer BLB. In FIGS. 6A and 6B, although the lower wiring line forming layer BLA in the memory cell array region is completely removed, it is not necessary to do so, and it is sufficient that the upper surface of the lower wiring line forming layer BLA is planarized.

Subsequently, as illustrated in FIGS. 7A and 7B, a main wiring line forming layer BLC, a conductive layer 104A serving as the electrode 104, a semiconductor layer DIA serving as the current-rectifying element DI, a conductive layer 108A serving as the electrode 108, a variable resistance layer 109A serving as the variable resistance element 109, a conductive layer 110A serving as the electrode 110, a conductive layer 111A serving as the top electrode 111, and a hard mask (HM) layer 112 are sequentially deposited on the substrate 101 and the lower wiring line forming layer BLB. Then, a line-and-space resist pattern 113 is formed thereon. A conductor such as TiN can be used as the conductive layers 104A and 110A, and a conductor such as TiN or Ti can be used as the conductive layer 108A. Moreover, $TiO_2$, NiO, MeOx, HfO, carbon, and the like can be used as the variable resistance layer 109A. A conductor such as W can be used as the conductive layer 111A, and $SiO_2$, SiN, C, and the like can be used as the HM layer 112. A sidewall transfer method, an ArF immersion patterning method, and the like can be used as a method of patterning the resist pattern 113. In the embodiment, although the main wiring line forming layer BLC is deposited on the lower wiring line forming layer BLB, if the lower wiring line forming layer BLA is deposited on the substrate 101 to a large thickness so that a sufficient thickness is secured in a portion corresponding to the memory cell array region on the substrate 101 when performing planarization according to a CMP method or the like, the lower wiring line forming layer BLB and the main wiring line forming layer BLC can be formed simultaneously. If necessary, a barrier metal film (formed of Ti, TiN, WN, or the like, or a stacked film of these materials) may be formed under the lower wiring line layer BLA, the main wiring line forming layer BLC, or the like in advance. In this way, the wiring line resistance can be further decreased.

Subsequently, as illustrated in FIGS. 8A and 8B, the HM layer 112 and the conductive layer 111A are processed by etching using the resist pattern 113 as a mask. Then, etching is performed on a range of regions from the lower wiring line forming layer BLB to the conductive layer 110A using the processed HM layer 112 as a mask. In this way, a structure in which the main wiring line layer BLm, the lower wiring line layer BLl, a conductive layer 104B, a semiconductor layer DIB, a conductive layer 108B, a variable resistance layer 109B, a conductive layer 110B, and a conductive layer 111B are stacked is formed. Here, since it is necessary to divide the lower wiring line forming layer BLB and the main wiring line forming layer BLC in the arrangement direction of the bit lines BL to form the lower wiring line layer BL1 and the main wiring line layer BLm, the stacked structure is etched in the memory cell array region to a depth deeper than the main wiring line layer BLm.

Figure 9A:
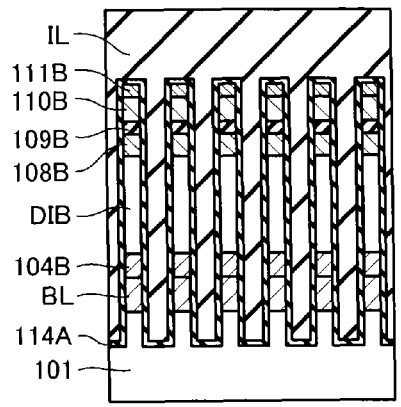
FIGS. 9A and 9B are side cross-sectional views for explaining a method of manufacturing the memory cell array.
Figure 9B:
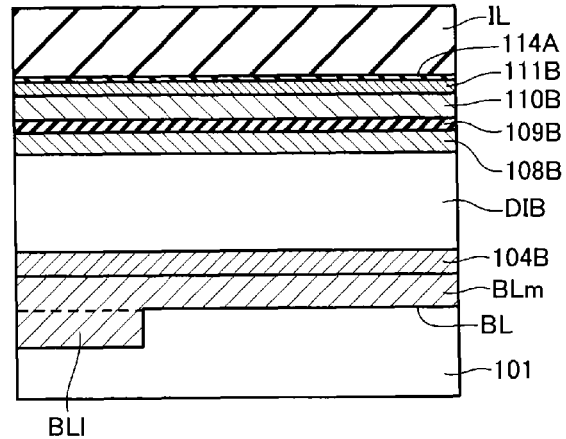

Subsequently, as illustrated in FIGS. 9A and 9B, an insulating layer 114A serving as the barrier layer 114 is formed so as to cover the front surface of the substrate 101, the side walls of the bit line BL, the conductive layer 104B, the semiconductor layer DIB, the conductive layer 108B, the variable resistance layer 109B, and the conductive layers 110B and 111B and the upper surface of the conductive layer 111B. As the insulating layer 114A, ALD-SiN, PeCVD-SiN, and the like can be used.

Figure 10A:
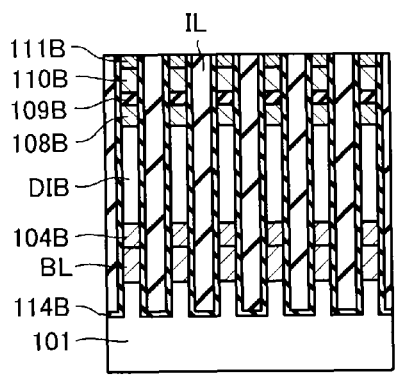
FIGS. 10A and 10B are side cross-sectional views for explaining a method of manufacturing the memory cell array.
Figure 10B:
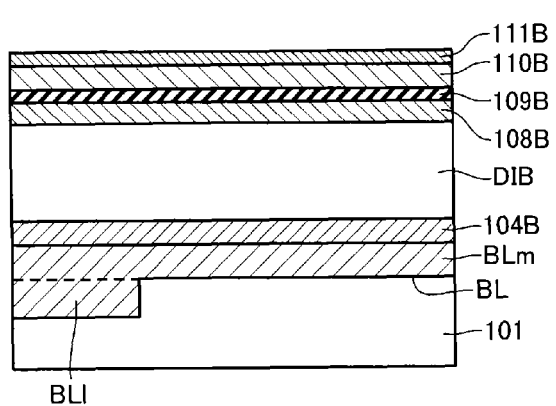

Subsequently, an interlayer insulating layer IL is deposited and steam oxidation is performed. If the interlayer insulating layer IL is not a coating layer, the steam oxidation treatment is not necessary. Then, as illustrated in FIGS. 10A and 10B, the interlayer insulating layer IL and the insulating layer 114A are removed by CMP until the conductive layer 111B is exposed. The insulating layer 114A of which the upper surface is polished is denoted by an insulating layer 114B.

Figure 11A:
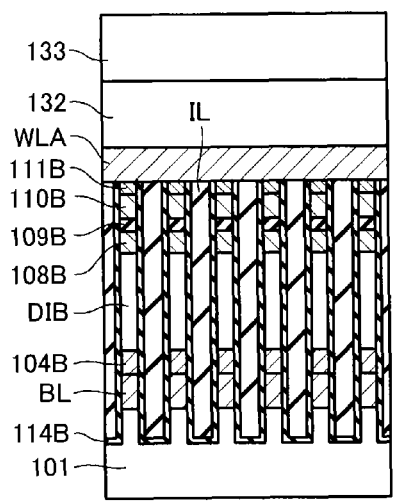
FIGS. 11A and 11B are side cross-sectional views for explaining a method of manufacturing the memory cell array.
Figure 11B:
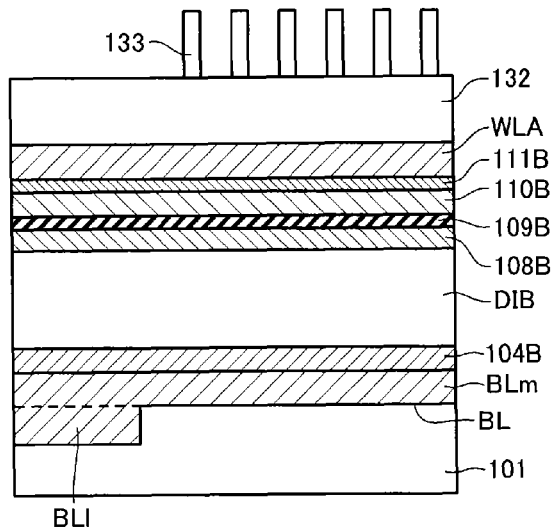
Figure 12A:
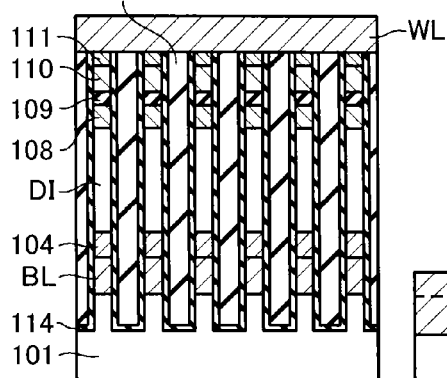
FIGS. 12A and 12B are side cross-sectional views for explaining a method of manufacturing the memory cell array.
Figure 12B:
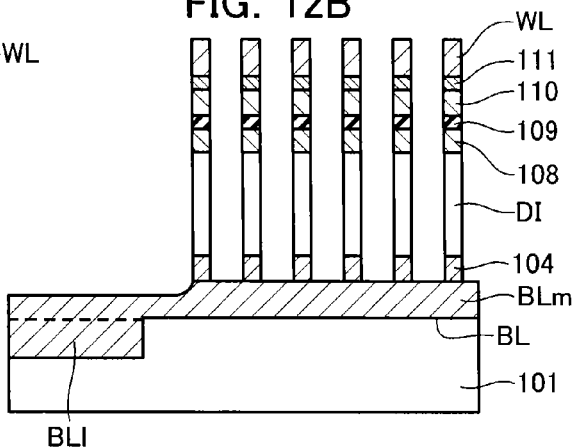

Subsequently, as illustrated in FIGS. 11A and 11B, a word line forming layer WLA, a HM layer 132, and a resist pattern 133 are deposited on the upper surfaces of the interlayer insulating layer IL, the insulating layer 114B, and the conductive layer 111B. Then, as illustrated in FIGS. 12A and 12B, etching is performed up to the upper surface of the bit line BL. In this way, the bit lines BL, the electrode 104, the current-rectifying element DI, the electrode 108, the variable resistance layer 109, the electrode 110, the top electrode 111, and the word lines WL are formed. In this etching step, a so-called loading effect occurs such that the etching rate in the peripheral circuit region where the pattern is not formed is faster than the etching rate in the memory cell array region where the pattern is formed. As a result, the thickness of the bit lines BL in the peripheral region is smaller than that of the memory cell array region. However, in the embodiment, since the lower wiring line layer BL1 is provided in the peripheral circuit region under the bit line BL, it is possible to prevent the thinning of the bit lines BL.

Then, the barrier layer 134 is formed and the interlayer insulating layer IL is filled therebetween. In this way, it is possible to manufacture the structure as illustrated in FIGS. 2A and 2B.

[Second Embodiment]
[Memory Cell Array]

Figure 13A:
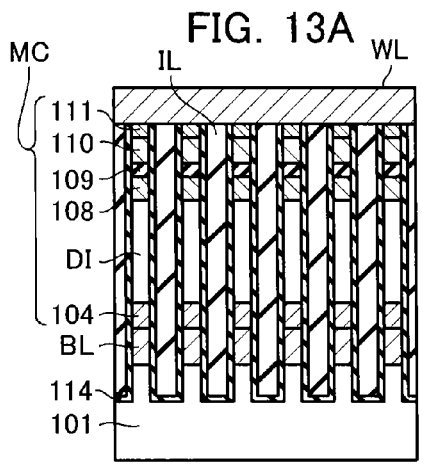
FIGS. 13A and 13B are side cross-sectional views illustrating the structure of a memory cell array of a semiconductor memory device according to a second embodiment.
Figure 13B:
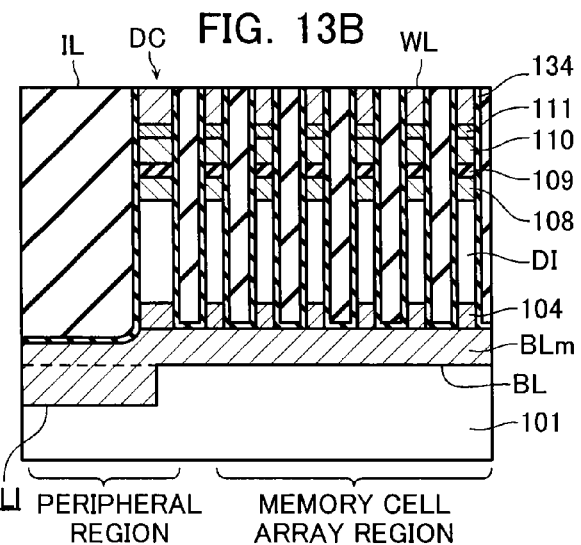

Next, the configuration of a semiconductor memory device according to the second embodiment will be explained. FIGS. 13A and 13B are cross-sectional views for explaining the configuration of the semiconductor memory device according to the second embodiment, in which FIG. 13A is a cross-sectional view as seen from the extension direction of a bit line BL, and FIG. 13B is a cross-sectional view as seen from the extension direction of a word line WL. Although the semiconductor memory device according to the embodiment is basically the same as that of the first embodiment, the semiconductor memory device of the second embodiment is different from that of the first embodiment in that a dummy cell DC is formed in a portion on the bit line BL immediately above an end portion of the lower wiring line layer BL1 close to the memory cell array region, and a height difference between the memory cell array region and the peripheral region is provided on an upper surface of the bit line BL so as to extend from an end portion of the dummy cell DC toward the peripheral region.

In the first embodiment, there is a possibility that a thin portion of the bit line BL is formed at the boundary between the memory cell array region and the peripheral circuit region. However, in the embodiment, since the dummy cell DC is provided at the boundary between the memory cell array region and the peripheral circuit region, a sufficient thickness is secured in a portion of the bit line BL immediately below the dummy cell DC. In this way, it is possible to further suppress an increase in the wiring line resistance.

[Manufacturing Method]

Next, a method of manufacturing the semiconductor memory device according to the second embodiment will be explained. The method of manufacturing the semiconductor memory device according to the second embodiment up to the steps illustrated in FIGS. 10A and 10B is the same as those of the first embodiment.

Figure 14A:
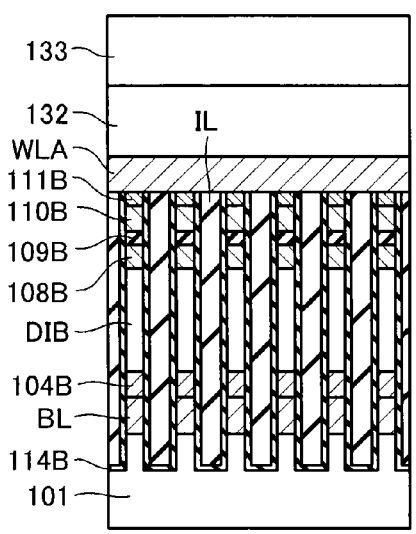
FIGS. 14A and 14B are side cross-sectional views for explaining a method of manufacturing the memory cell array.
Figure 14B:
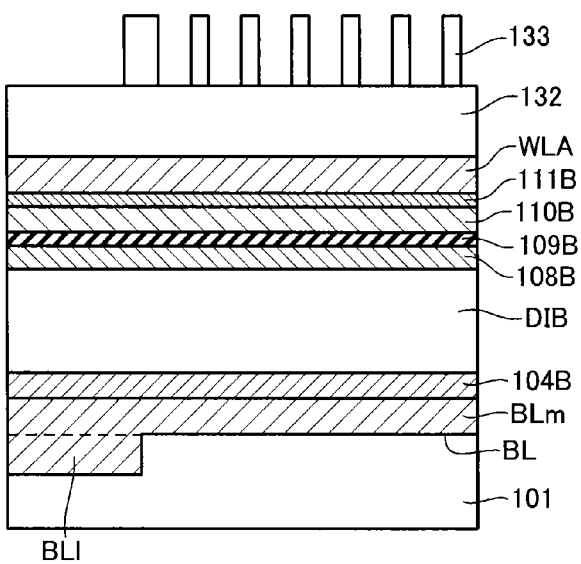
Figure 15A:
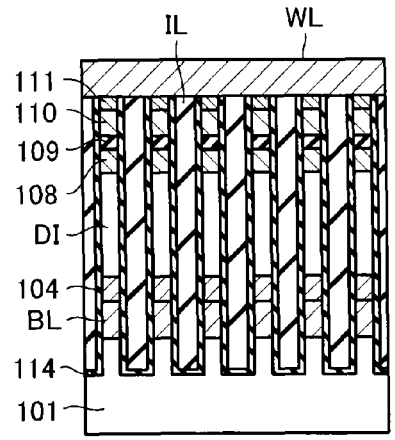
FIGS. 15A and 15B are side cross-sectional views for explaining a method of manufacturing the memory cell array.
Figure 15B:
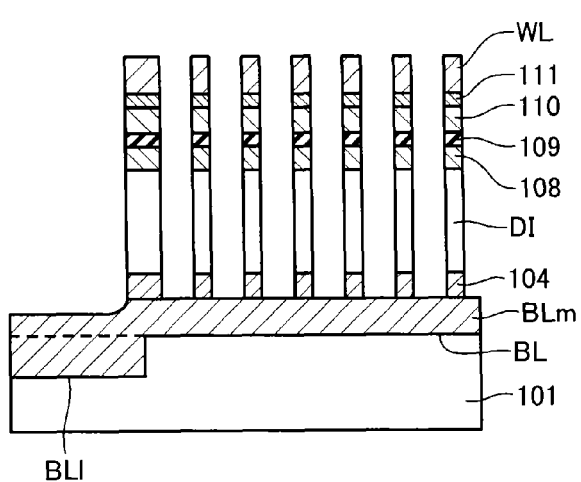

Subsequently, as illustrated in FIGS. 14A and 14B, the word line forming layer WLA, the HM layer 132, and the resist pattern 133 are deposited on the upper surfaces of the interlayer insulating layer IL, the insulating layer 114B, and the conductive layer 111B. In the second embodiment, the pattern of the dummy cell DC is also formed when forming the resist pattern 133. Subsequently, etching is performed as illustrated in FIGS. 15A and 15B, whereby the bit lines BL, the electrode 104, the current-rectifying element DI, the electrode 108, the variable resistance layer 109, the electrode 110, the top electrode 111, and the word lines WL are formed. In this etching step, although the loading effect occurs similarly to the first embodiment, since the dummy cell DC is formed at the boundary between the memory cell array region and the peripheral circuit region, the thinning of the bit lines BL due to the loading effect occurs around the boundary at the side walls of the dummy cell within the peripheral circuit region. Moreover, the end portion of the lower wiring line layer BL1 is positioned immediately below the dummy cell. Thus, it is possible to suppress an increase of the wiring line resistance resulting from the thinning of the bit lines BL occurring at the boundary between the peripheral circuit region and the memory cell array region.

Then, the barrier layer 134 is formed and an interlayer insulating layer IL is filled therebetween. In this way, it is possible to manufacture the structure as illustrated in FIGS. 13A and 13B.

[Third Embodiment]

Figure 16:
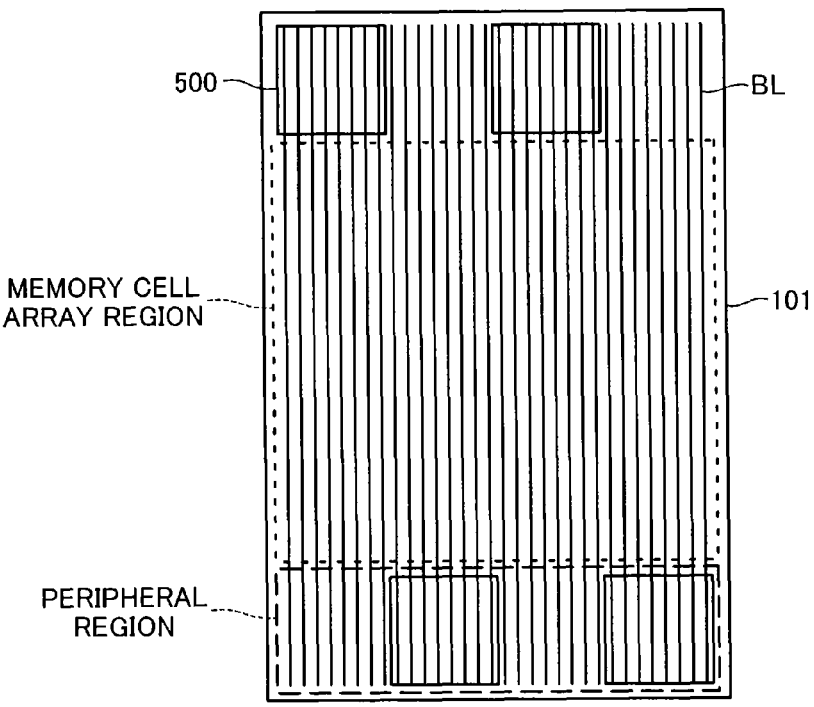
FIG. 16 is a plan view illustrating the structure of a memory cell array of a semiconductor memory device according to a third embodiment.

Next, a semiconductor memory device according to the third embodiment will be explained with reference to FIG. 16. If etching is performed on the entire peripheral region when the substrate 101 is etched to provide the concave portion 500, a dishing effect occurs in a planarization process using CMP or the like after depositing the lower wiring line forming layer BLA. Thus, there is a possibility that it is not possible to maintain the thickness of the lower wiring line forming layer BLA. Therefore, in the embodiment, as illustrated in FIG. 16, the concave portions 500 are alternately formed with the memory cell array region interposed. The plurality of (for example, eight) bit lines BL correspond to the concave portions 500, and lower wiring line layers BL1 corresponding to the number (for example, eight) of bit lines BL corresponding to the concave portions 500 are formed in one concave portion 500. In the embodiment, it is possible to suppress the thinning of the lower wiring line layer BL1 due to the dishing effect by reducing an area corresponding to one concave portion 500.

[Fourth Embodiment]

Next, a semiconductor memory device according to the fourth embodiment will be explained. In the first to third embodiments, although the lower wiring line layer BL1 is provided on the lower surface of the bit line BL which is formed under the memory cell MC, the lower wiring line layer BL1 may be formed on the lower surface of the bit line BL which is on the upper layer of the memory cell MC. Alternatively, a lower wiring line layer WLl may be formed on the lower surface of the word line WL. FIGS. 17A and 17B are cross-sectional views for explaining the configuration of a memory cell array according to the embodiment, in which FIG. 17A is a cross-sectional view as seen from the extension direction of the bit lines BL, and FIG. 17B is a cross-sectional view as seen from the extension direction of the word lines WL. In the embodiment, two memory cell array layers are stacked, and the word lines WL are shared by the upper and lower layers of the stacked memory cell array layers. The lower wiring line layer BLl and the lower wiring line layer WLl are respectively formed on the lower surfaces of the bit lines BL and the word lines WL which are on the lower layers.

[Manufacturing Method]

Figure 18B:
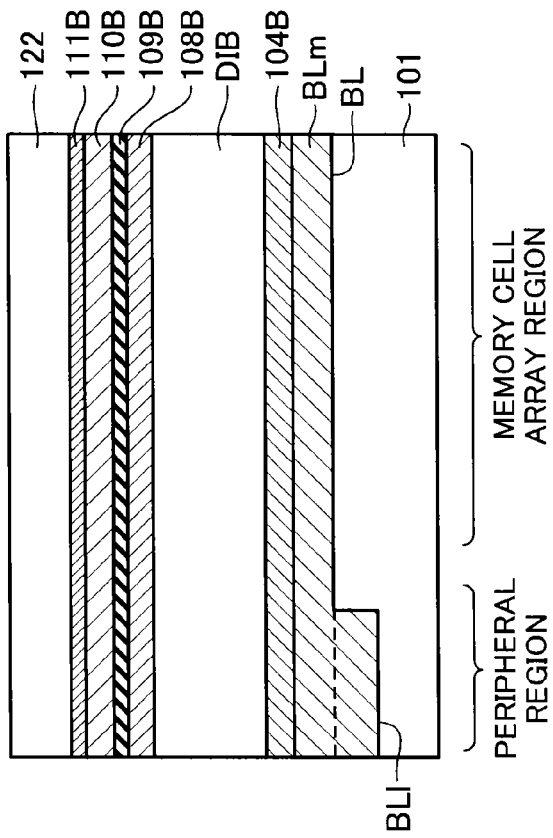
FIGS. 18A and 18B are side cross-sectional views for explaining a method of manufacturing the memory cell array.
Figure 18A:
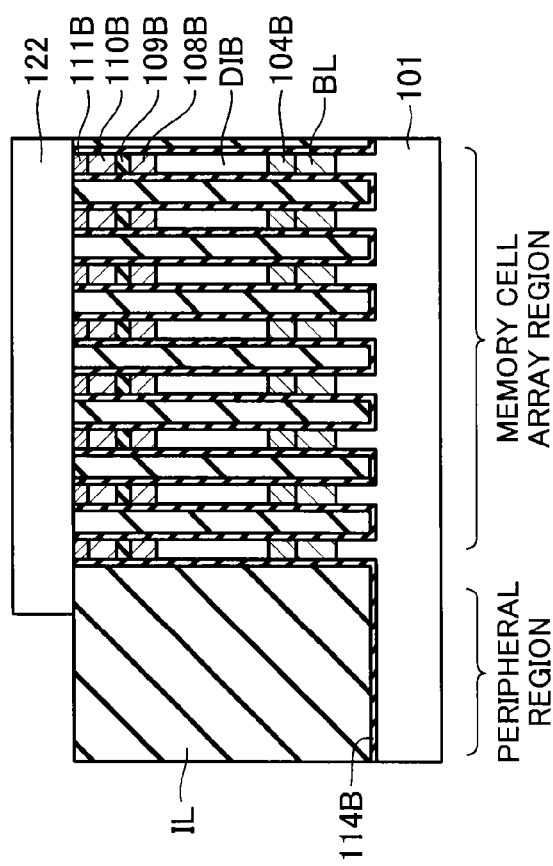

Next, a method of manufacturing the semiconductor memory device according to the present embodiment will be explained. The method of manufacturing the semiconductor memory device according to the embodiment up to the steps illustrated in FIGS. 13A and 13B is the same as those of the first embodiment. After obtaining the structure illustrated in FIGS. 13A and 13B, as illustrated in FIGS. 18A and 18B, a mask 122 is deposited so as to cover the entire memory cell array region.

Figure 19A:
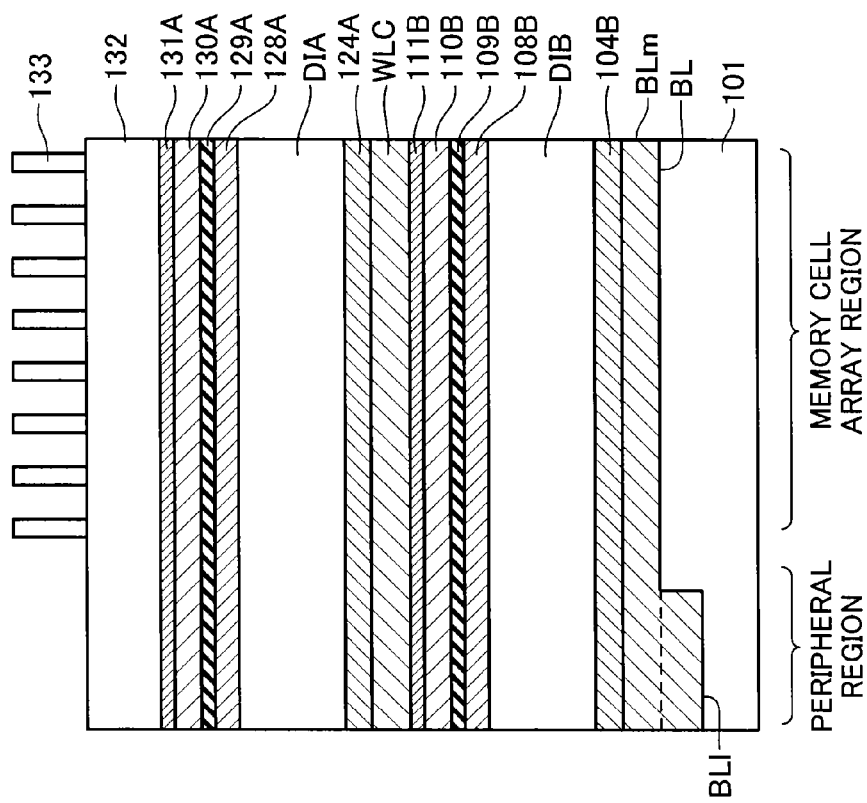
FIGS. 19A and 19B are side cross-sectional views for explaining a method of manufacturing the memory cell array.
Figure 19B:
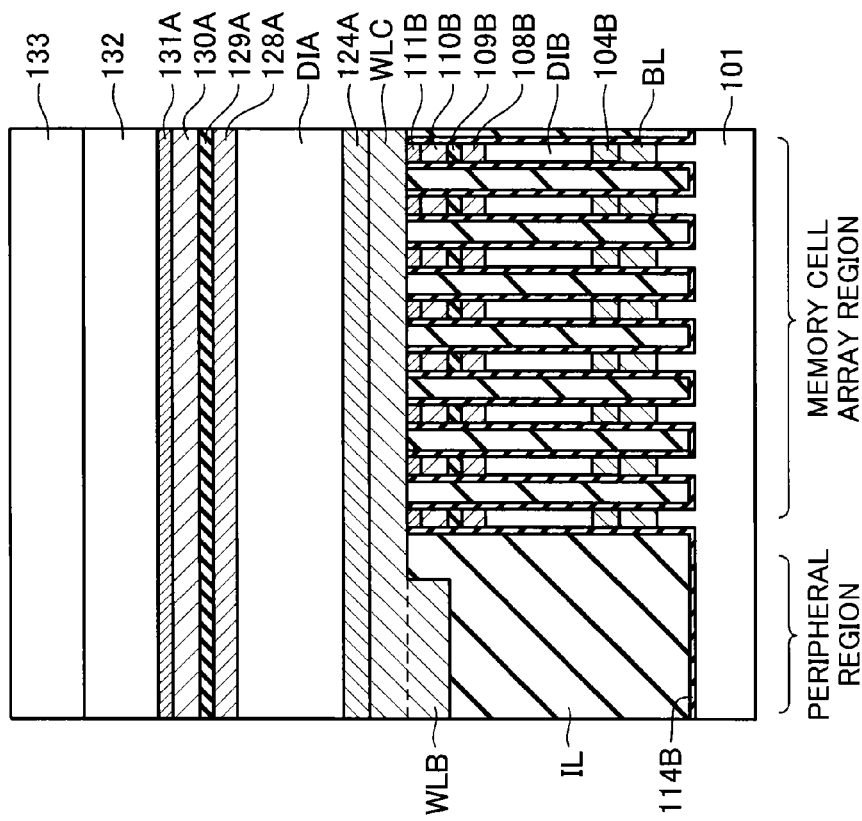

Subsequently, as illustrated in FIGS. 19A and 19B, etching is performed on a portion of the interlayer insulating layer IL corresponding to the peripheral region using the mask 122 as a mask to form a concave portion. Then, the lower wiring line forming layer serving as the lower wiring line layer WLl is filled in the concave portion and is planarized according to a CMP method or the like to thereby form a lower wiring line forming layer WLB. In this case, similarly to the first embodiment, the lower wiring line forming layer WLA in the memory cell array region may be completely removed or may remain. Further, a main wiring line forming layer WLC that forms the main wiring line layer WLm, a conductive layer 124A serving as the electrode 124, a semiconductor layer DIA that forms the current-rectifying element DI, a conductive layer 128A serving as the electrode 128, a variable resistance layer 129A that forms the variable resistance element 129, a conductive layer 130A that forms the electrode 130, a conductive layer 131A that forms the top electrode 131, and an HM layer 132 are deposited thereon. Then, a resist pattern 133 is formed thereon.

Figure 20B:
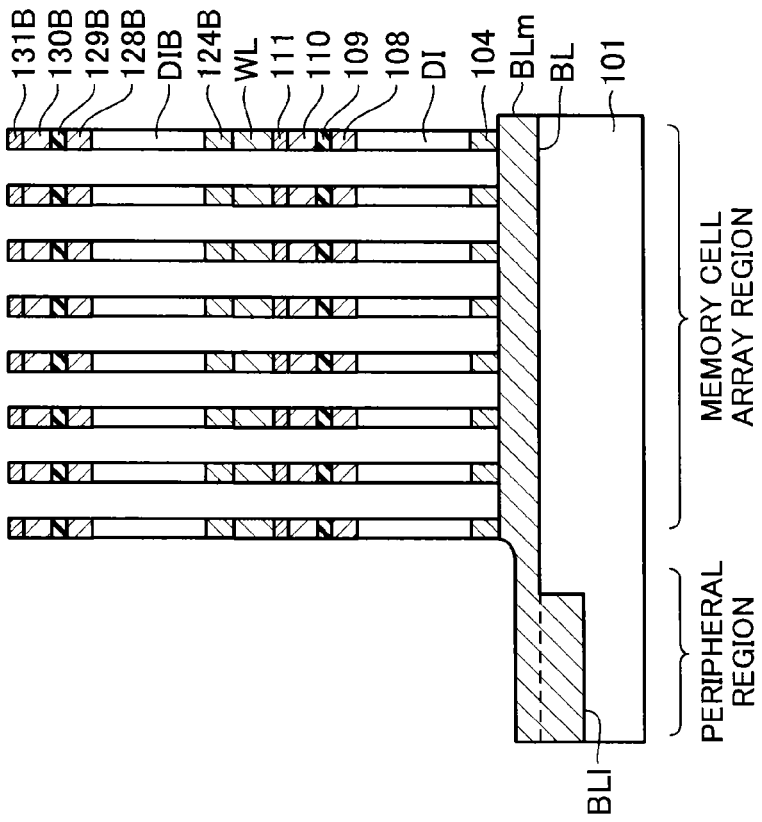
FIGS. 20A and 20B are side cross-sectional views for explaining a method of manufacturing the memory cell array.
Figure 20A:
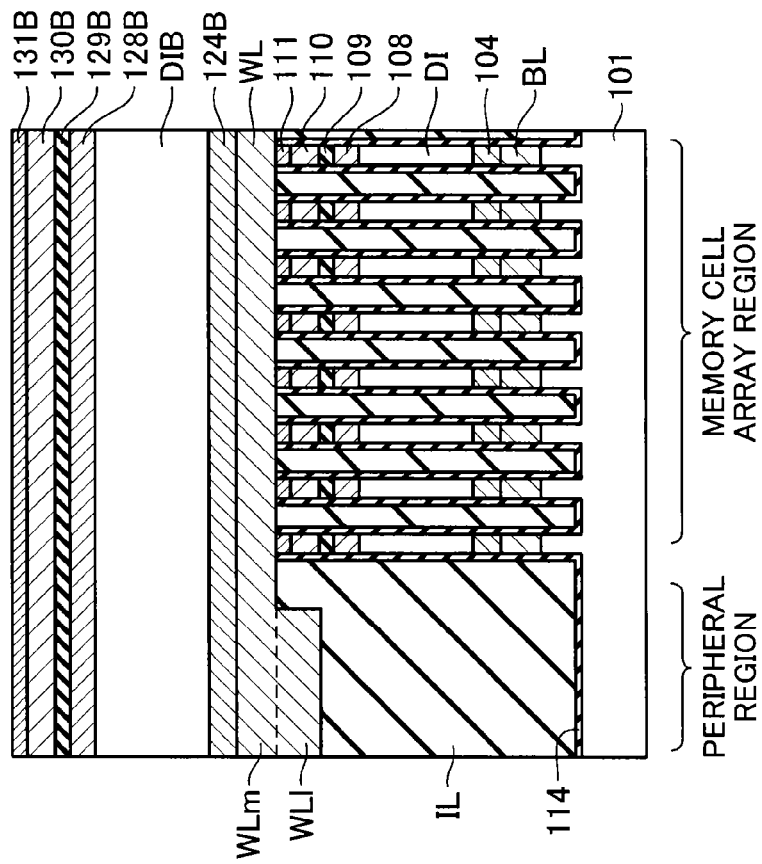

Subsequently, etching is performed on the HM layer 132 and the conductive layer 131A using the resist pattern 133 as a mask. Further, as illustrated in FIGS. 20A and 20B, etching is performed using the HM layer 132 and the conductive layer 131A as masks to form a structure in which the bit lines BL, the electrode 104, the current-rectifying element DI, the electrode 108, the variable resistance element 109, the electrode 110, the top electrode 111, the lower wiring line layer WLl, the main wiring line layer WLm, the conductive layer 124B, the semiconductor layer DIB, the conductive layer 128B, the variable resistance layer 129B, and the conductive layers 130B and 131B are stacked. In this case, the loading effect occurs in the bit lines BL.

Figure 21A:
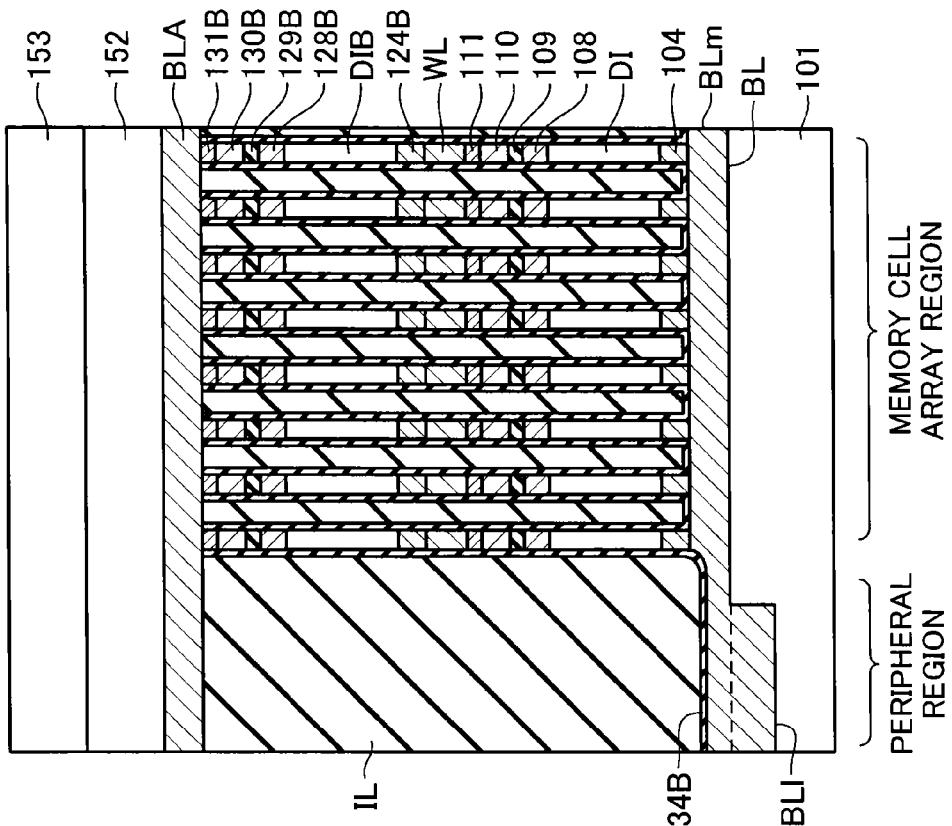
FIGS. 21A and 21B are side cross-sectional views for explaining a method of manufacturing the memory cell array.
Figure 21B:
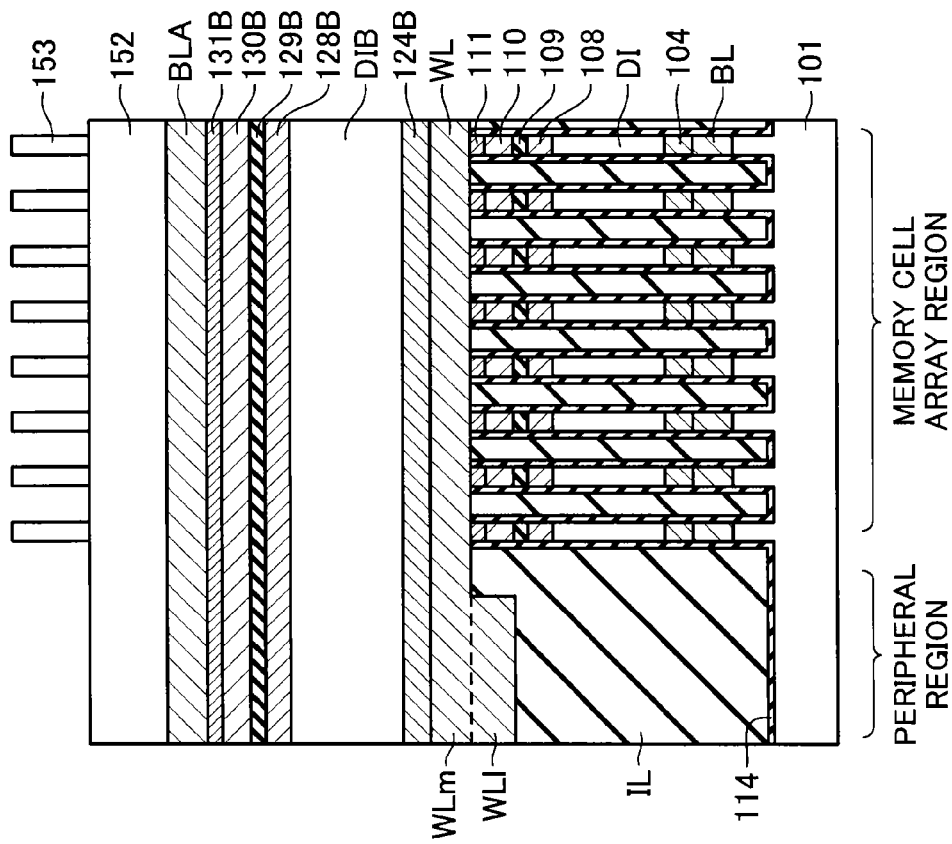

Subsequently, a barrier layer is formed on the side walls of the patterns, and an interlayer insulating layer IL is filled between the patterns. Then, the upper surfaces of the interlayer insulating layer IL and the barrier layer are planarized by a CMP method or the like to form a barrier layer 134B and to expose the conductive layer 131B. Then, as illustrated in FIGS. 21A and 21B, a bit line forming layer BLA and an HM layer 152 are deposited thereon, and a mask pattern 153 is formed thereon.

Figure 22B:
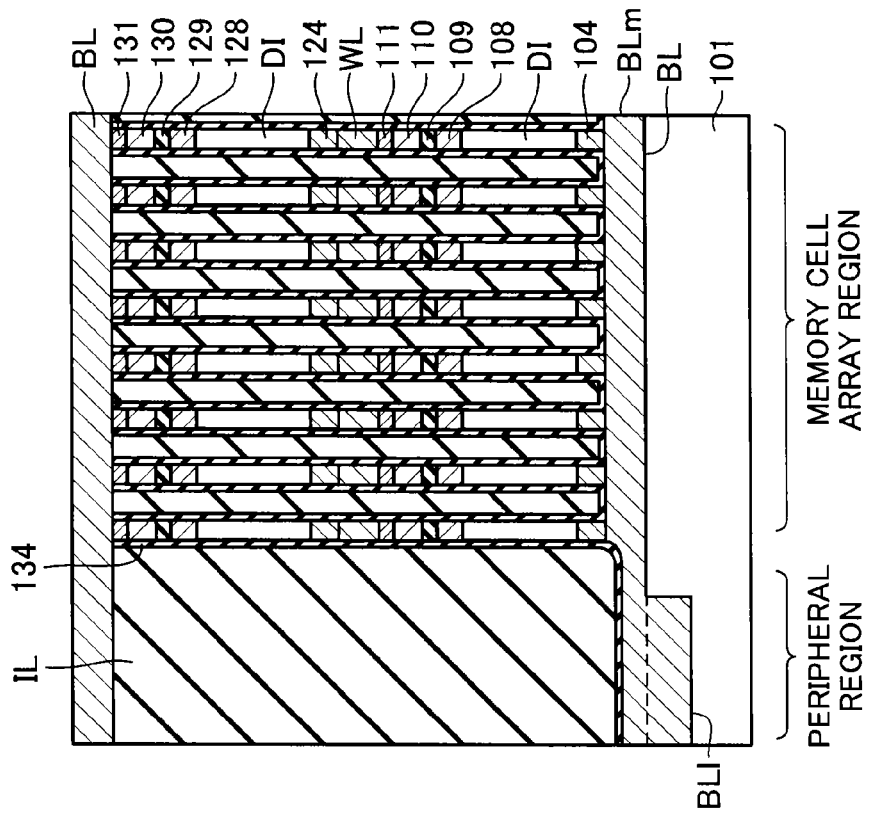
FIGS. 22A and 22B are side cross-sectional views for explaining a method of manufacturing the memory cell array.
Figure 22A:
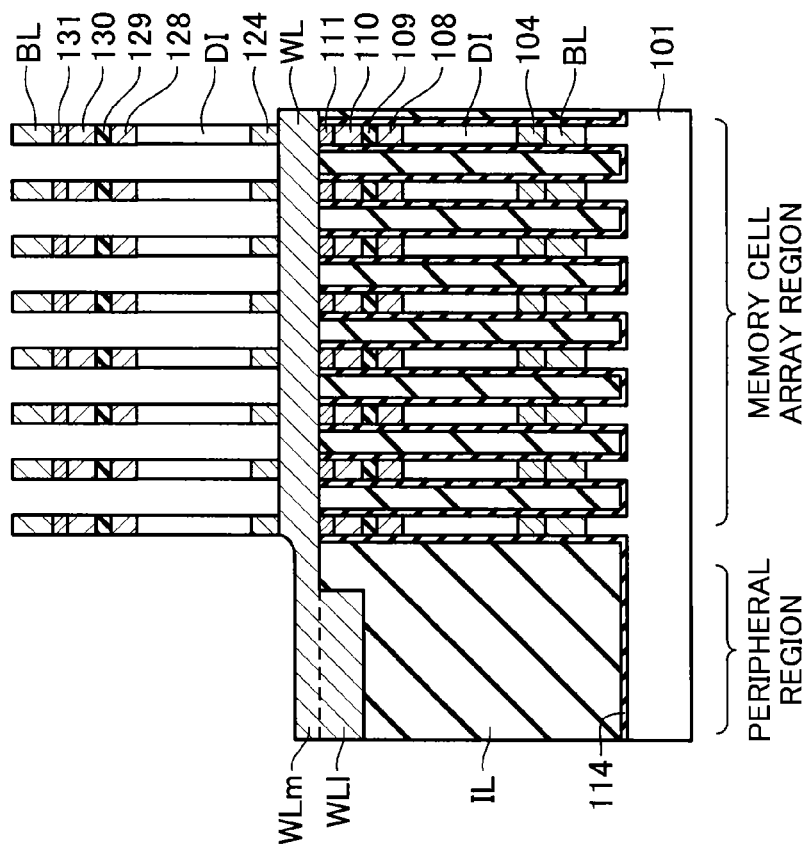

Subsequently, etching is performed on the HM layer 152 using the mask pattern 153 as a mask. Then, as illustrated in FIGS. 22A and 22B, etching is performed using the HM layer 152 as a mask to form a structure in which the word lines WL, the electrode 124, the current-rectifying element DI, the electrode 128, the variable resistance element 129, the electrode 130, the top electrode 131, and the bit lines BL are stacked.

Then, a barrier layer 154 is formed on the side walls of the patterns and an interlayer insulating layer IL is filled therebetween. In this way, it is possible to manufacture the structure as illustrated in FIGS. 17A and 17B.

In the embodiment, although an example of manufacturing two memory cell array layers has been explained, naturally, three memory cell array layers or more may be stacked. In this case, the lower wiring line layer can be appropriately provided on the lower surfaces of the bit lines BL and the word lines WL.

[Fifth Embodiment]

Figure 23A:
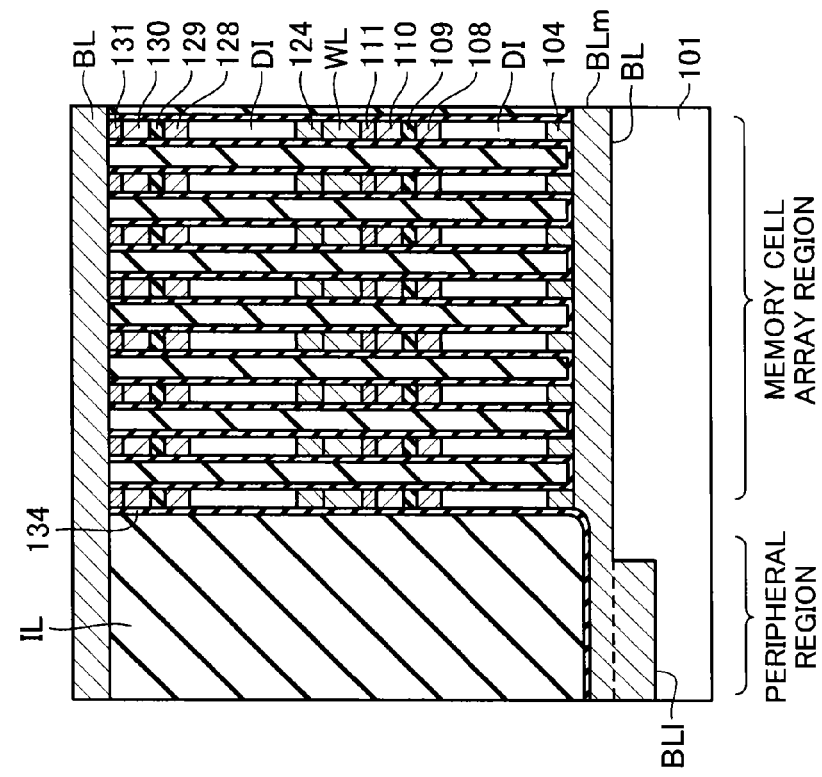
FIGS. 23A and 23B are side cross-sectional views illustrating the structure of a memory cell array of a semiconductor memory device according to a fifth embodiment.
Figure 23B:
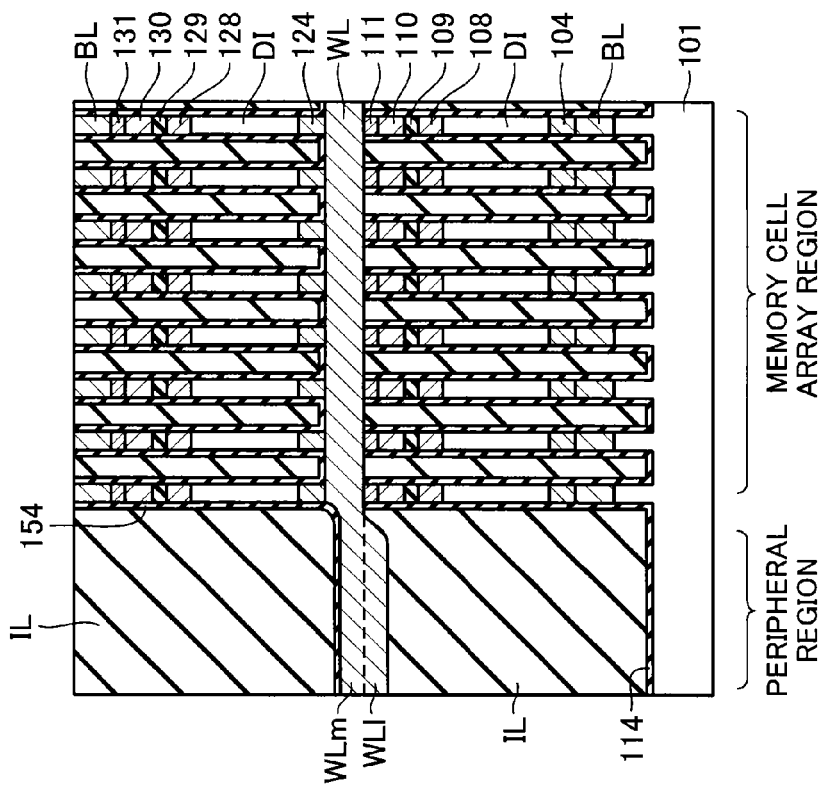

Next, a semiconductor memory device according to the fifth embodiment will be explained. In the first to fourth embodiments, the concave portion 500 has been formed by etching. However, the concave portion 500 may be formed by causing the dishing effect to occur intentionally. In this case, as illustrated in FIGS. 23A and 23B, the end portions of the lower wiring line layer WLl have a smoother shape than those of the first to fourth embodiments.

[Manufacturing Method]

Figure 24B:
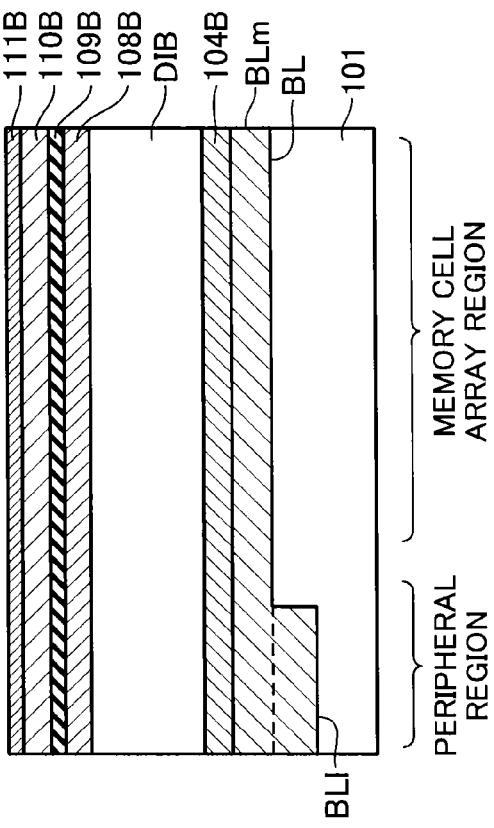
FIGS. 24A and 24B are side cross-sectional views for explaining a method of manufacturing the memory cell array.
Figure 24A:
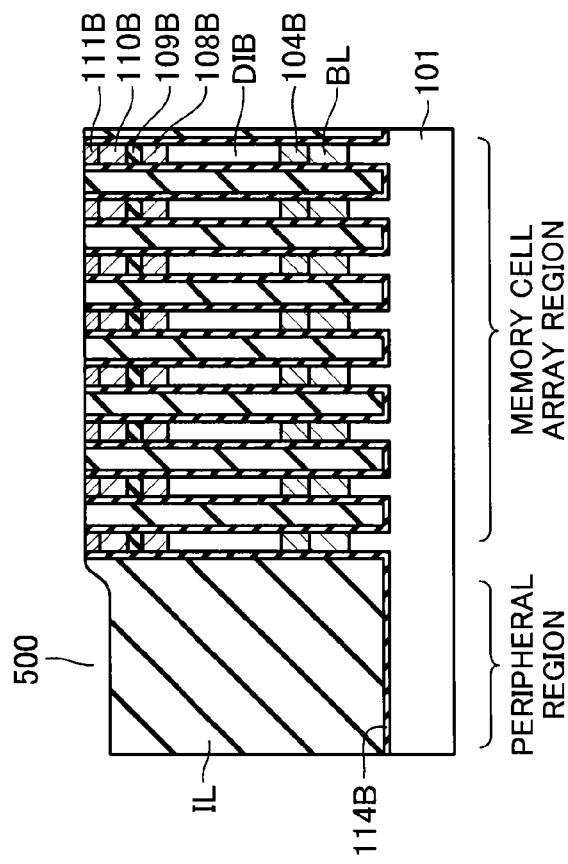
Figure 25B:
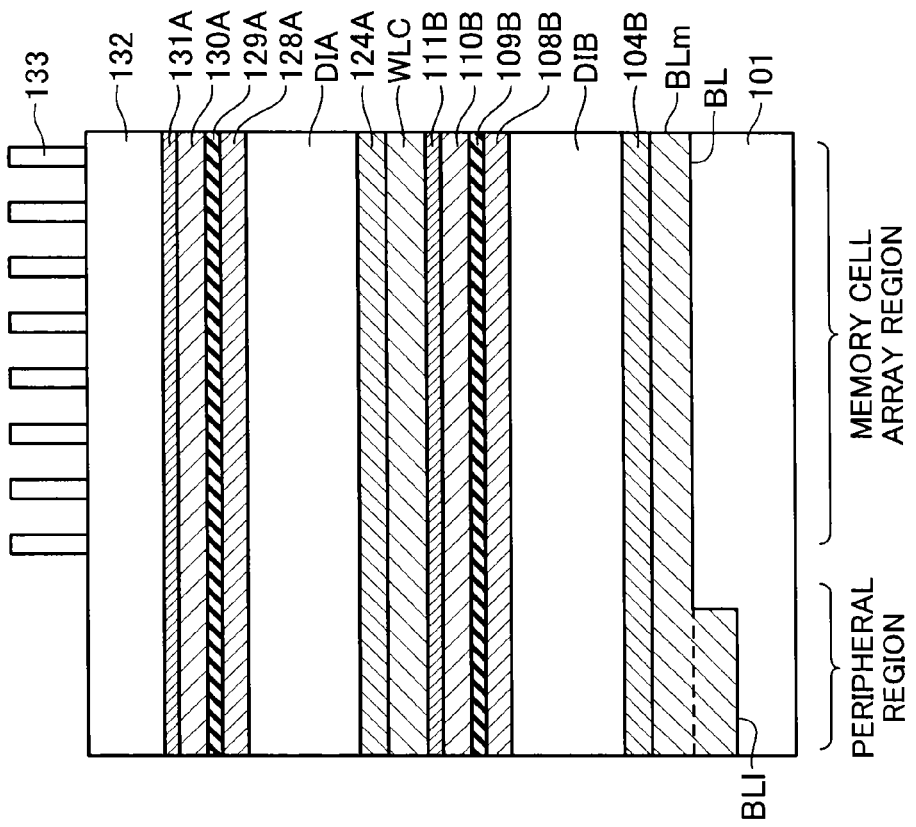
FIGS. 25A and 25B are side cross-sectional views for explaining a method of manufacturing the memory cell array.
Figure 25A:
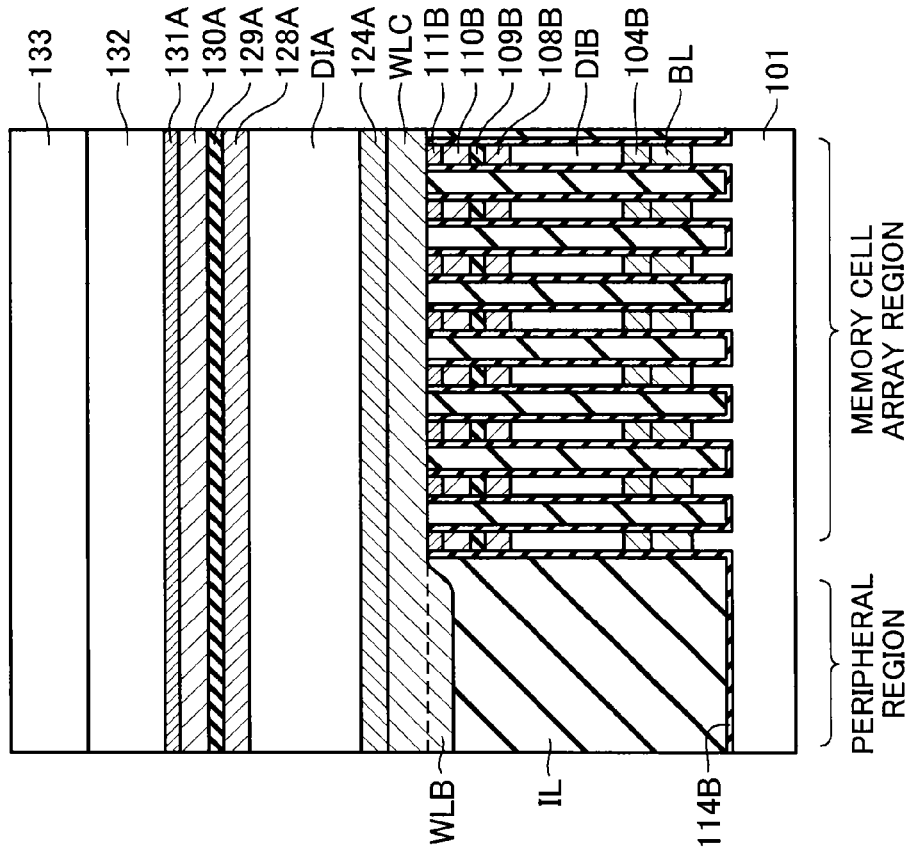
Figure 26A:
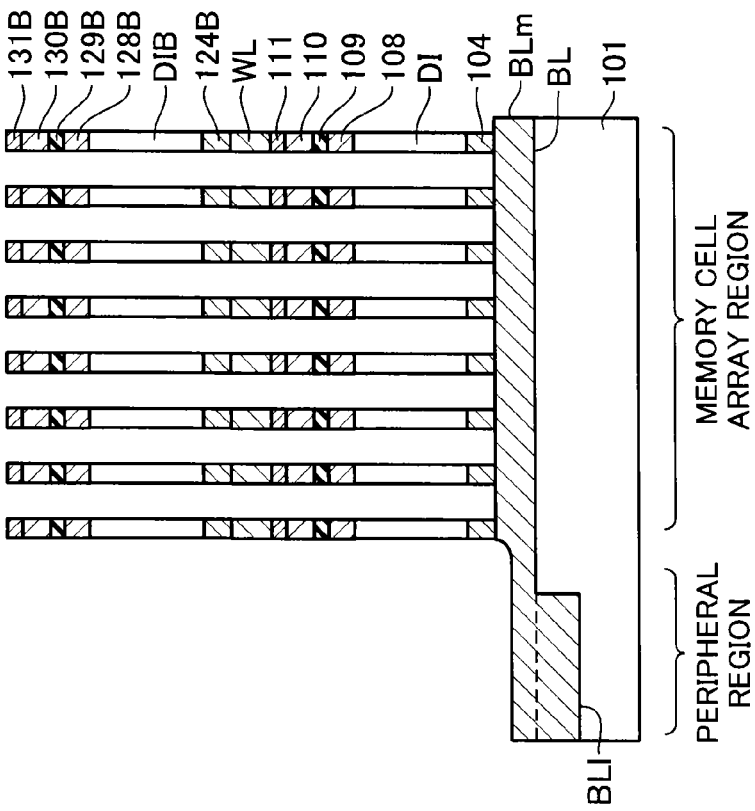
FIGS. 26A and 26B are side cross-sectional views for explaining a method of manufacturing the memory cell array.
Figure 26B:
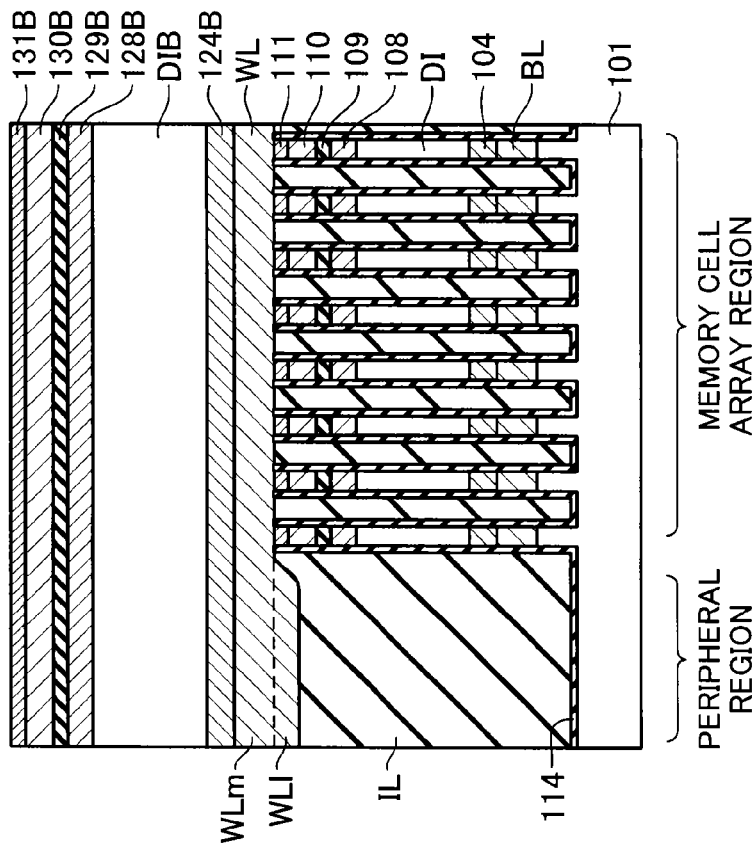
Figure 27A:
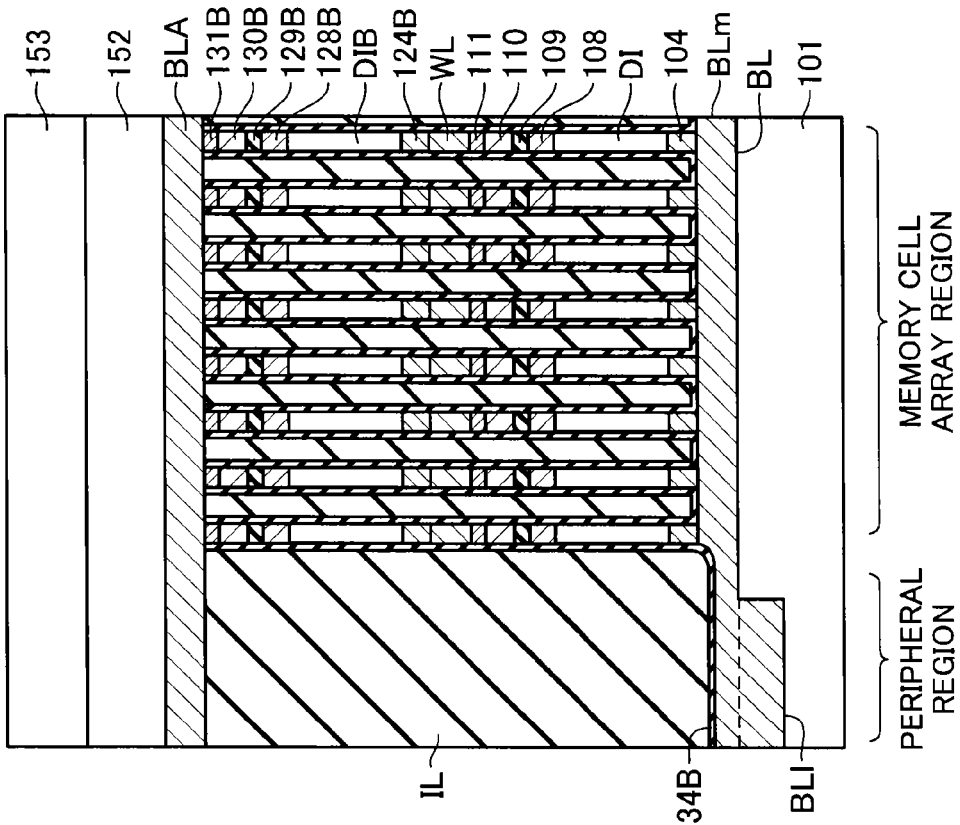
FIGS. 27A and 27B are side cross-sectional views for explaining a method of manufacturing the memory cell array.
Figure 27B:
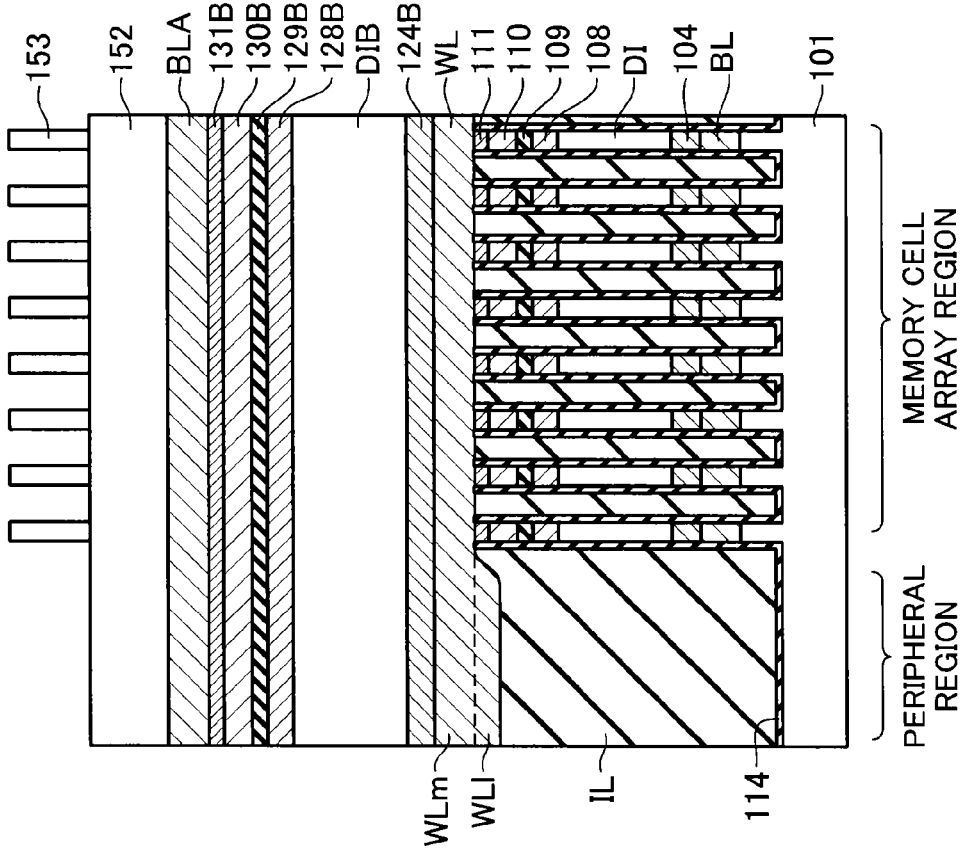
Figure 28A:
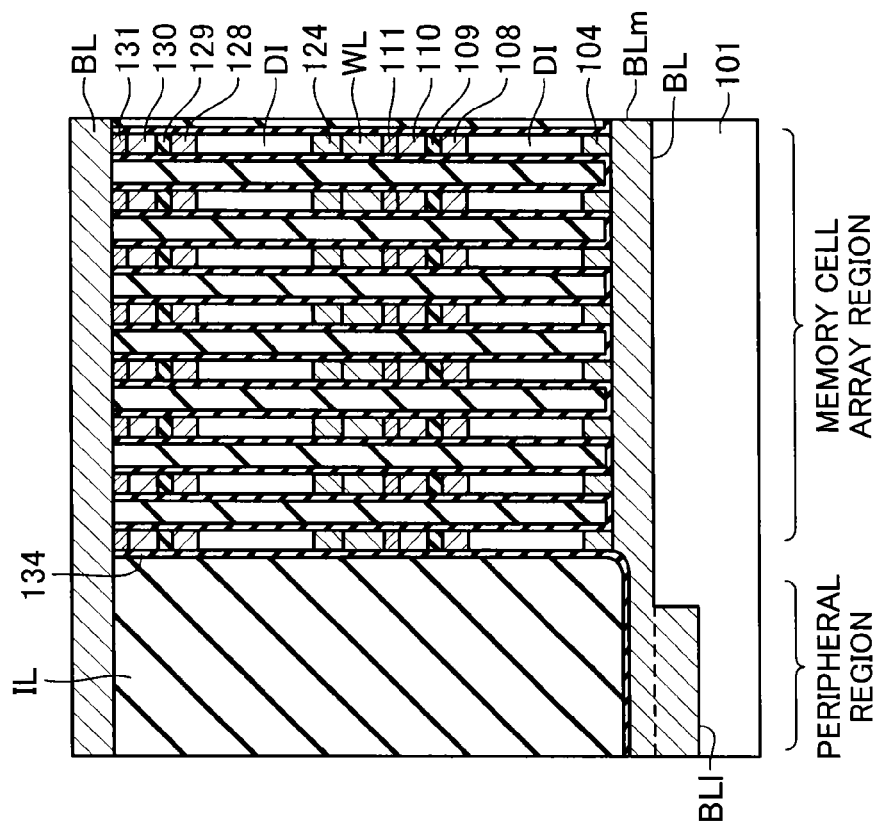
FIGS. 28A and 28B are side cross-sectional views for explaining a method of manufacturing the memory cell array.
Figure 28B:
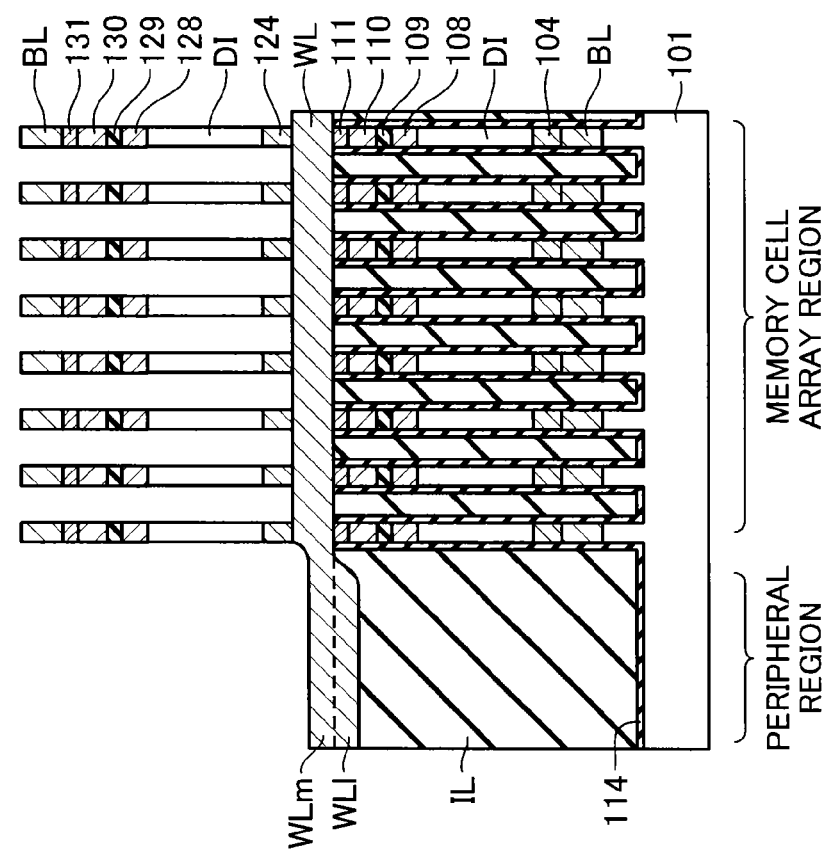

Next, a method of manufacturing the semiconductor memory device according to the embodiment will be explained. The method of manufacturing the semiconductor memory device according to the embodiment up to the steps illustrated in FIGS. 9A and 9B is the same as those of the first embodiment. As illustrated in FIGS. 24A and 24B, CMP is performed on the structure illustrated in FIGS. 9A and 9B to expose the conductive layer 111B and to form the barrier layer 114B. In this case, the concave portion 500 is formed by intentionally causing the dishing effect to occur in the peripheral region. Then, as illustrated in FIGS. 25A to 28B, it is possible to manufacture the structure as illustrated in FIGS. 23A and 23B through the same steps as the steps explained using FIGS. 19A to 22B.

In the embodiment, similarly to the fourth embodiment, although an example of manufacturing two memory cell array layers has been explained, naturally, three memory cell array layers or more may be stacked. In this case, the lower wiring line layer can be appropriately provided on the lower surfaces of the bit lines BL and the word lines WL.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising a memory cell array which includes a first wiring line, a memory cell disposed above the first wiring line, and a second wiring line disposed on the memory cell, wherein
   a step is formed in the first wiring line so that a height of an upper surface of the first wiring line in a memory cell array region where the memory cell array is formed is higher than a height in a peripheral region around the memory cell array region, the first wiring line includes a main wiring line layer formed over the memory cell array region and the peripheral region, and a lower wiring line layer formed in the peripheral region on a lower surface of the main wiring line layer, a height of an upper surface of the main wiring line layer in the peripheral region is lower than a height in the memory cell array region, a dummy cell is provided on a portion of the first wiring line immediately above an end portion of the lower wiring line layer close to the memory cell array region, and the step is formed in the first wiring line so that the height of an upper surface of the first wiring line in a region from an end portion of the dummy cell toward the peripheral region is lower than the height in the memory cell array region.

2. The semiconductor memory device according to claim 1, wherein a predetermined number of the first wiring lines are alternately led out to the peripheral regions on both sides of the memory cell array region, and the lower wiring line layer is formed in the led-out portion.

3. The semiconductor memory device according to claim 1, wherein a barrier metal is present under at least one of the first and second wiring lines.

4. The semiconductor memory device according to claim 1, further comprising a memory cell array which includes a memory cell stacked on the second wiring line and a third wiring line formed on the memory cell so as to intersect the second wiring line, wherein a step is formed in the second wiring line so that a height of the upper surface of the second wiring line in the memory cell array region is higher than that in the peripheral region.

5. The semiconductor memory device according to claim 1, wherein a thickness of the first wiring line in the peripheral region is equal to or greater than a thickness of the first wiring line in the memory cell array region.

* * * * *